United States Patent [19]

Roemer et al.

[11] Patent Number: 4,737,716
[45] Date of Patent: Apr. 12, 1988

[54] SELF-SHIELDED GRADIENT COILS FOR NUCLEAR MAGNETIC RESONANCE IMAGING

[75] Inventors: Peter B. Roemer, Schenectady; John S. Hickey, Burnt Hills, both of N.Y.

[73] Assignee: General Electric Company, Milwaukee, Wis.

[21] Appl. No.: 826,650

[22] Filed: Feb. 6, 1986

[51] Int. Cl.$^4$ ............................................. G01R 33/20
[52] U.S. Cl. ...................................... 324/319; 324/318
[58] Field of Search ............... 324/300, 313, 309, 318, 324/319, 320, 322; 336/225; 335/216, 299, 209, 210, 216

[56] References Cited

U.S. PATENT DOCUMENTS

| | | | |
|---|---|---|---|
| 4,126,781 | 11/1978 | Siegel | 250/281 |
| 4,310,799 | 1/1982 | Hutchison | 324/319 |
| 4,398,149 | 8/1983 | Zens | 324/300 |
| 4,456,881 | 6/1984 | Compton | 324/309 |
| 4,509,030 | 4/1985 | Vermilyea | 324/320 |
| 4,595,899 | 6/1986 | Smith et al. | 324/320 |
| 4,612,505 | 9/1986 | Zijlstra | 324/318 |
| 4,617,516 | 10/1986 | Schenck | 324/318 |
| 4,621,236 | 11/1986 | Halbach | 324/319 |
| 4,639,672 | 1/1987 | Beaumont | 324/318 |
| 4,646,024 | 2/1987 | Schenck | 324/318 |

OTHER PUBLICATIONS

U.S. Ser. No. 548,174, Schenck et al., "Transverse Gradient Field Coils for Nuclear Magnetic Resonance Imaging:, filed Nov. 2, 1983, (see p. 5 of the specification.)
U.S. Ser. No. 795,024, Edelstein et al., "Current Streamline Method for Coil Construction", filed Nov. 4, 1985, (see p. 5 of the specification.)

Primary Examiner—Michael J. Tokar
Attorney, Agent, or Firm—Mark L. Mollon; Douglas E. Stoner

[57] ABSTRACT

A two coil system is described which produces a linear gradient field inside and an arbitrarily low field outside the two coil set. By eliminating the field outside the gradient coils, interaction between the gradient coils and external structure can be eliminated. A reduction in eddy current effects of greater than a factor 100 are readily obtained. Two coils are required for each gradient axis instead of one so that some increase in power supply capability may be required.

14 Claims, 12 Drawing Sheets

SELF-SHIELDED GRADIENT COILS FOR NUCLEAR MAGNETIC RESONANCE IMAGING

BACKGROUND OF THE INVENTION

The present invention relates in general to a coil system for producing a gradient magnetic field used in magnetic resonance imaging and spectroscopy, and more specifically to a coil system for producing a magnetic field having a linear gradient in the interior of the coil system and having a substantially zero value exterior of the coil system.

Magnetic resonance (MR) imaging systems are currently employed in forming tomographic images of the internal human anatomy. In such systems, a patient is placed in a static magnetic field and is subjected to radio-frequency electromagnetic pulses. The magnetic resonance of the atomic nuclei of the patient are detected with an antenna to provide information from which an image of that portion of the patient containing these nuclei may be formed. The magnetic field possesses linear gradients in each of the three spatial dimensions so that the position of resonating nuclei can be determined. These same phenomena are employed in magnetic resonance spectroscopy for analyzing properties of nuclei.

Typically, a main magnet establishes a uniform magnetic field of high strength and the linear gradients are superimposed on that magnetic field by gradient coils located within the main magnet interior. The main magnet may be comprised of a superconducting coil, a resistive coil, or a set of permanent magnets. A gradient coil may be comprised of windings etched on a flexible printed circuit board which is curved to form a cylinder or may be comprised of conductors held by a frame in their proper locations.

Bringing the inner bore of the main magnet close to the imaging volume, and thus close to the gradient coils, enhances the efficiency of the magnet in terms of amount of material, cost and, except for permanent magnets, power consumption. However, the close proximity of the magnet to the gradient coils leads to undesirable interactions between them.

For instance, where the main magnet includes electrically conductive material (e.g. neodymium permanent magnets or the cryostat of a superconducting magnet), the changing magnetic fields of the gradient coils induce currents in the conductive material. These currents distort the magnetic field in the imaging volume in both time and space. Furthermore, when permanent magnets are used, the eddy currents dissipate power which appears as heat, distorting the magnetic field even more. The solution of placing a conducting shield between the gradient coils and the magnets merely shifts the eddy currents to the shield and so the distortions of the gradient fields persist.

Magnetic interaction between the main magnet and the gradient coils also results in attractive and repulsive forces which create annoying audible sound. Structural supports having high strength and rigidity have been employed in attempts to reduce audible sound from the gradient coils, but with limited success.

Accordingly, it is a principal object of the present invention to reduce interaction between the main magnet and the gradient coils of an MR imaging system.

It is another object of the present invention to provide a coil system for producing a magnetic field having a substantially linear gradient in the interior of the coil system and having a substantially zero value exterior of the coil system.

It is a further object of the invention to practically eliminate currents in the main magnet induced by the magnetic fields of the gradient coils.

It is yet another object of the invention to reduce audible sound from the gradient coils of a nuclear magnetic resonance imaging system.

SUMMARY OF THE INVENTION

These and other objects are achieved in a coil system for producing a magnetic field which comprises first and second coils. The first coil is adapted to be coupled to a source of current for providing a first surface current on the surface of a first cylinder having a radius $r_i$ and an axial length $z_i$. The second coil is adapted to be coupled to a source of current for providing a second surface current on the surface of a second cylinder substantially coaxial with the first cylinder and having a radius $r_o$ greater than $r_i$ and an axial length $z_o$. The first and second surface currents are adapted to provide a magnetic field having a predetermined gradient in a predetermined dimension and a substantially constant value across the other two dimensions within the volume enclosed by the first coil and having a substantially zero value in the volume outside of the second coil.

BRIEF DESCRIPTION OF THE DRAWINGS

The novel features of the invention are set forth with particularity in the appended claims. The invention itself, however, as to organization and method of operation, together with further objects and advantages thereof, may best be understood by reference to the following description taken in conjunction with the accompanying drawings in which:

DETAILED DESCRIPTION OF THE INVENTION

Figure 1A:
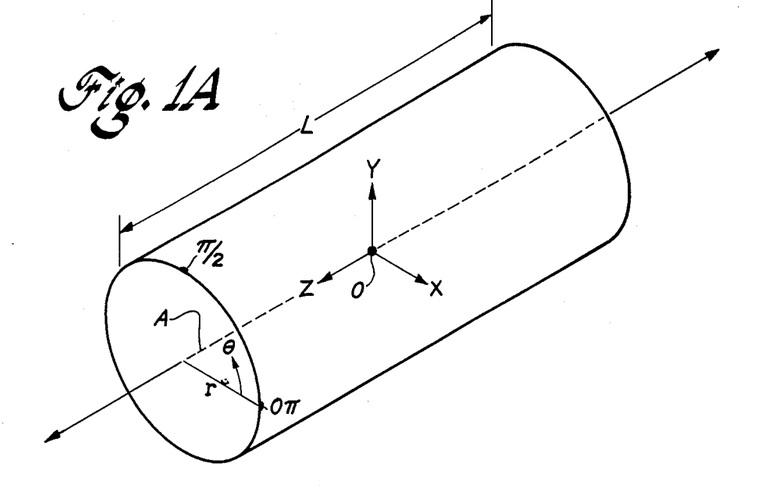
FIG. 1A is a perspective view of a single coil on a printed circuit board for producing a gradient field.

Referring now to the drawings, FIG. 1A shows a cylindrical gradient coil 10 with length L and central axis A, for producing a gradient magnetic field in its interior. The three spatial dimensions x, y and z are shown extending from an origin O and with the z coordinate extending parallel to axis A, the x coordinate extending horizontally and the y coordinate extending vertically. Also shown are cylindrical coordinates r, $\theta$ and z which may be defined from x, y and z as follows:

$$z=z, \; r=(x^2+y^2)^{\frac{1}{2}} \; and \; \theta=arc \tan (y/x).$$

The coordinate systems define points on cylindrical coil 10, in its interior and in its exterior.

Figure 1B:
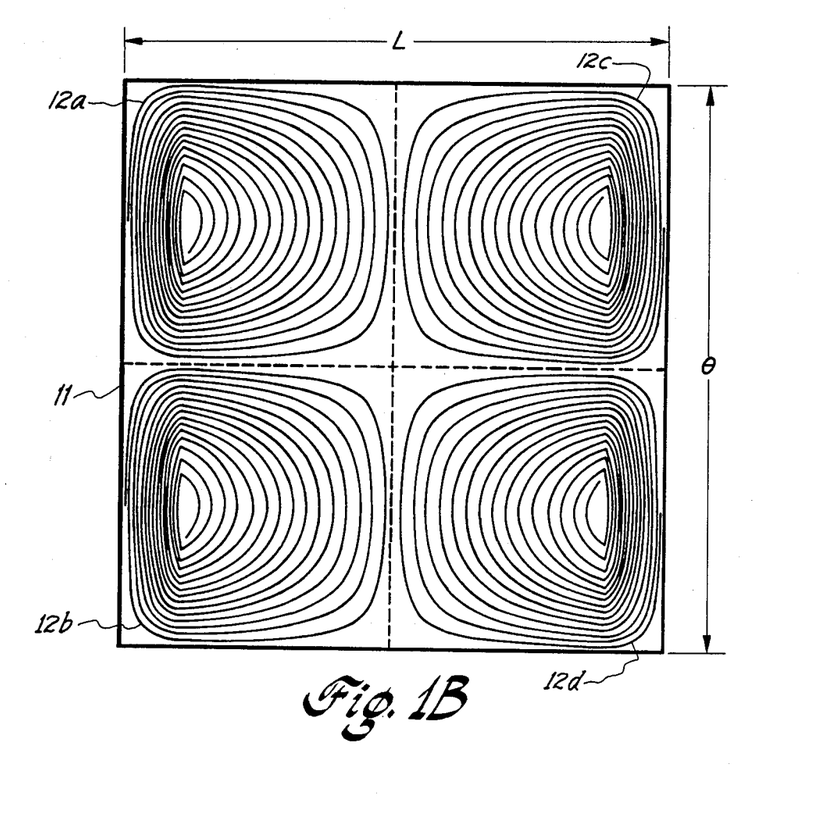
FIG. 1B is a diagram of the coil of FIG. 1A unrolled to show the configuration of the windings.

The windings of coil 10 may be formed on a flexible printed circuit board 11, as shown in FIG. 1B. Windings 12a-12d (also referred to as fingerprints) are etched on board 11 and have a configuration which provides the desired gradient magnetic field when board 11 is rolled into a cylinder and current is applied to windings 12a-12d. The winding pattern (i.e. surface currents) shown in FIG. 1B is in accordance with a gradient coil described in U.S. application Ser. No. 548,174, of Schenck et al., entitled "Transverse Gradient Field Coils for Nuclear Magnetic Resonance Imaging", filed Nov. 2, 1983, now U.S. Pat. No. 4,646,024, issued Feb. 24, 1987, of common assignment, which is hereby incorporated by reference. The etching of flexible circuit boards is described in U.S. application Ser. No. 795,024, of Edelstein et al., entitled "Current Streamline Method for Coil Construction", filed Nov. 4, 1985, of common assignment, which is hereby incorporated by reference.

Figures 2A, 2B, 7:
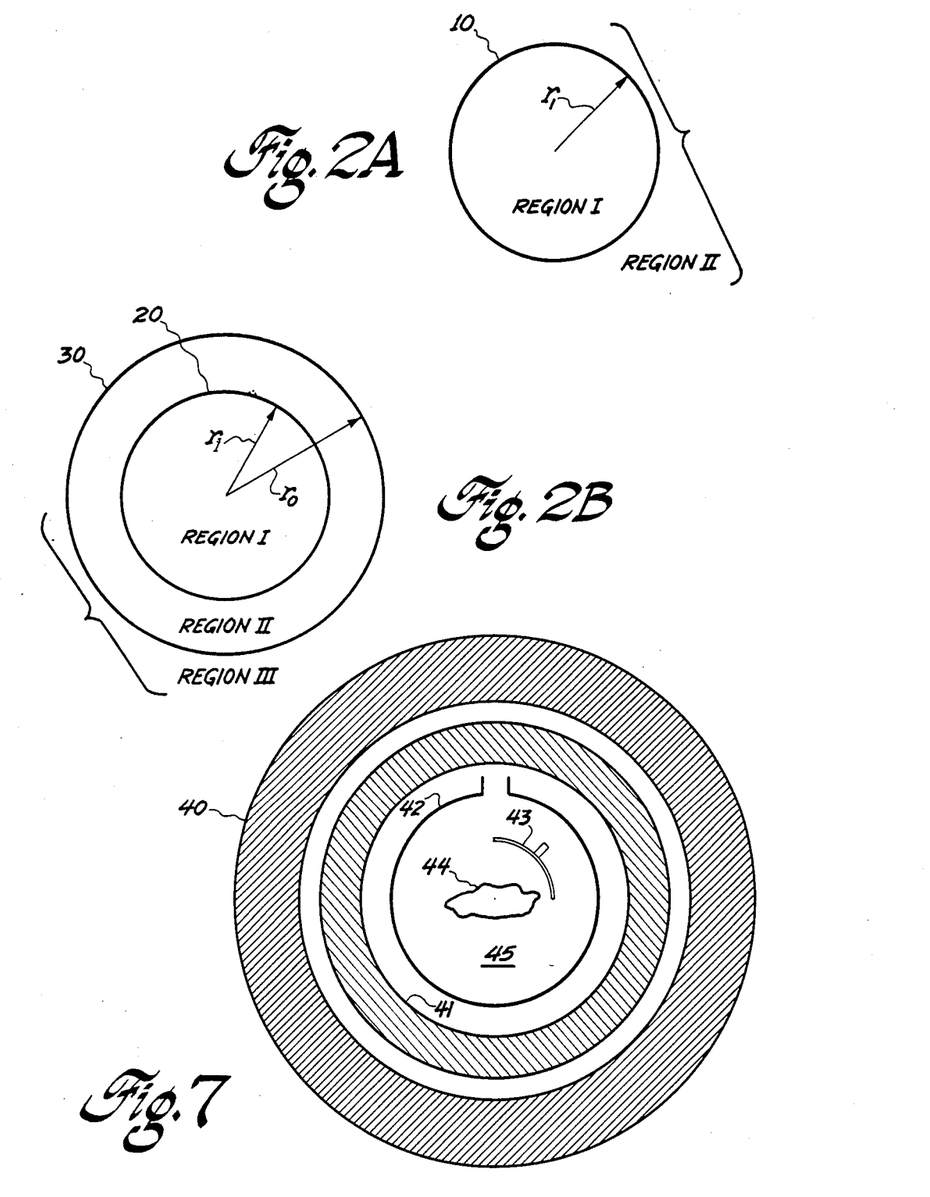
FIG. 2A is a cross-sectional view of the coil of FIG. 1A.
FIG. 2B is a cross-sectional view of a coil system in accordance with the present invention.
FIG. 7 is a cross-sectional view of a magnetic resonance system employing the invention.

Cylindrical coil 10 is shown in cross section in FIG. 2A. In this case, surface currents are restricted to a cylinder having radius $r_1$. Specification of a desired gradient magnetic field inside coil 10 in region I uniquely determines the required surface current distribution of coil 10 as well as a non-zero magnetic field outside of coil 10 in region II. Thus, any structure in region II (e.g. the main magnet) will be subjected to a time changing magnetic field from coil 10, thus inducing eddy currents which in turn distort the gradient in region I.

The coil set of the present invention is shown in cross section in FIG. 2B. A first coil 20 with a radius $r_i$ is coaxial with a second coil 30 with a radius $r_o$. Coils 20 and 30 are preferably connected in series so that a single power supply can supply equal current to each coil. A first surface current $\bar{J}_1$ may flow in coil 20 and a second surface current $\bar{J}_2$ may flow in coil 30. In this case, specification of a desired gradient magnetic field in region I does not uniquely determine the two current distributions. It is possible to impose the further condition that the magnetic field be equal to zero everywhere in region III, in which case fixing one surface current and the radii of the coils determines the other surface current. Exemplary methods for finding a pair of cylindrical surface currents which result in the desired gradient in region I and a zero field in region III will be described below. However, it will be apparent to those skilled in the art that surfaces other than cylinders could be used and that more than two coils could be provided so long as the sum of the magnetic fields has the desired gradient inside and a substantially zero value outside the coil set.

A convenient method for describing the surface currents of a gradient coil is by means of stream functions. A stream function S describes a flow in which every region of the flow is free from any sources or sinks (i.e. points where flow is produced or disappears). Lines of constant S are parallel to the flow (e.g. flow of surface current $\bar{J}$). Surface current $\bar{J}(z,\theta)$ is related to the stream function $S(z,\theta)$ derivatives and the $\hat{z}$ and $\hat{\theta}$ unit vectors as follows:

$$\bar{J}(z,\theta) = -(\partial S/\partial z)\hat{\theta} + (1/r)(\partial S/\partial \theta)\hat{z}.$$

The streamlines (i.e. lines of constant S) yielded by the stream functions are a series of concentric closed curves which are an idealized representation of surface current $\bar{J}$. The actual surface current is derived by plotting a number of streamlines separated by a predetermined step-size in S, breaking each closed curve at a point and joining each curve with the adjacent curves to form a spiral winding pattern. The breaking points are preferably substantially colinear so that a lead brought in from outside the coil to join the innermost portion of the spiral winding pattern can be placed in a parallel arrangement which substantially cancels the effects of breaking the streamlines.

Figure 3:
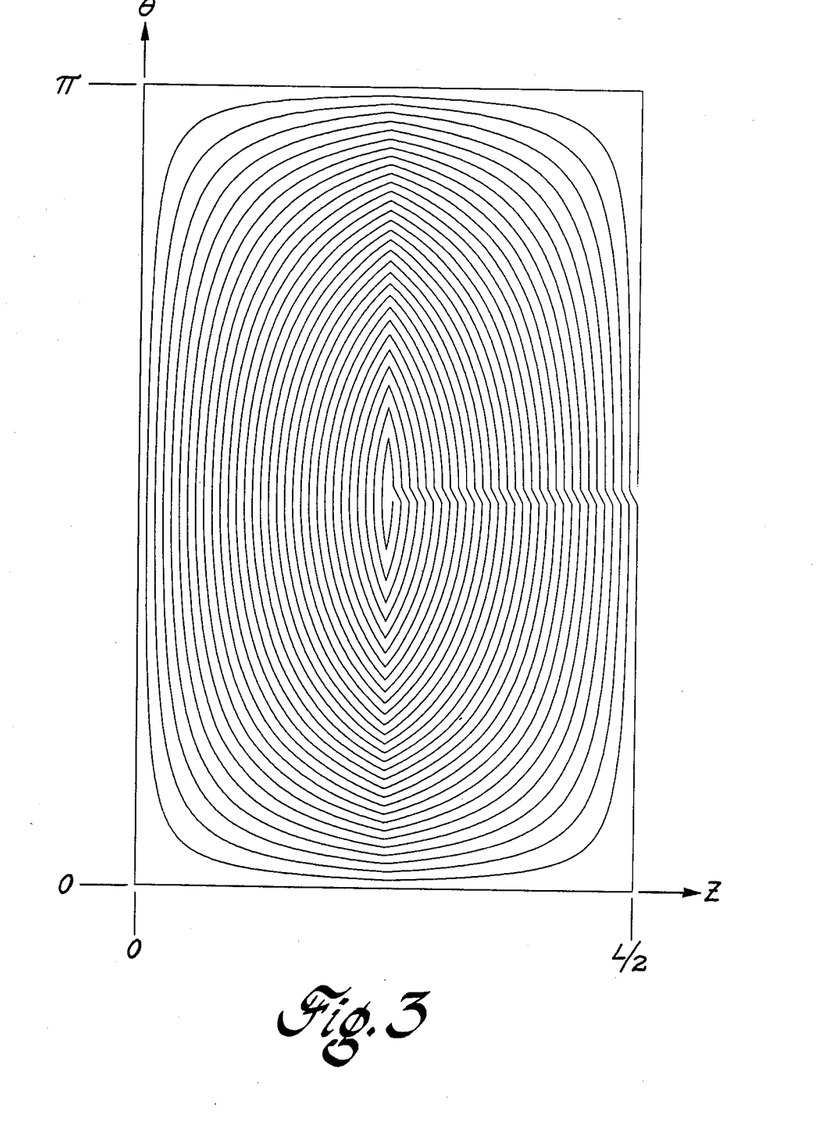
FIG. 3 is a winding pattern for a conventional gradient coil.

FIG. 3 is a winding pattern similar to a gradient coil winding pattern which is presently used in commercial NMR systems for providing an x-directed or a y-directed gradient. The plot corresponds to a fingerprint which is repeated four times in the gradient coil. The gradient coil has a length L and a radius $r_i$. Each fingerprint carries a current I, has N turns, has a length in z of L/2 and has a height in $\theta$ of $\pi$ radians.

A coil using the winding pattern of FIG. 3 may be employed as inner coil 20 of FIG. 2B. In that case, a winding pattern for the outer coil such that the sum of the magnetic fields of the inner and outer coils equals a substantially linear gradient field in region I and a substantially zero value in region III can be determined.

The first step in finding the desired winding pattern is to write the pre-defined surface current of the inner coil in terms of a stream function. For the example of FIG. 3, the stream function $S_1$ is:

$$S_1(z,\theta) = \begin{bmatrix} (-4NI/L)z \cdot \sin\theta & \text{for } |z| < L/4 \\ (4NI/L)(z - L/2)\sin\theta & \text{for } L/4 < z < L/2 \\ (4NI/L)(z + L/2)\sin\theta & \text{for } -L/2 < z < -L/4 \end{bmatrix}.$$

Fourier decomposition of the inner coil stream function $S_1$ yields:

$$S_1(z,\theta) = \int_o^\infty \frac{16NI}{\pi Lk^2} \left[ \sin\left(\frac{kL}{4}\right) - \frac{\sin\left(\frac{kL}{2}\right)}{2} \right] \sin\theta \sin(kz)dk.$$

Analysis of the magnetic fields produced by the inner and outer coils yields the following expression for an outer coil stream function $S_2$ which is chosen to give a zero magnetic field in region III:

$$S_2(z,\theta) = \int_o^\infty \frac{16NI}{\pi Lk^2} \left[ \sin\left(\frac{kL}{4}\right) - \right.$$

$$\left. \frac{\sin\left(\frac{kL}{2}\right)}{2} \right] \frac{r_i}{r_o} \frac{I_1'(kr_i)}{I_1'(kr_o)} \sin\theta\sin(kz)dk,$$

were $I_1$ is the modified Bessel function of the first kind and where ' denotes the derivative with respect to the total argument. Stream function $S_2$ gives a pattern of infinite length, however the importance of current at values of z larger than the inner coil length diminishes rapidly with increasing z. One possible method to obtain a finite length coil is to simply truncate the pattern. Another method which partially compensates for the effects of truncation is to force the magnetic field normal to the outer coil to zero over the length of the coil. As the coil length is increased, this condition will produce a winding pattern that approaches $S_2$. However, for any given finite length coil this condition will produce a coil with better shielding properties than the truncation of $S_2$.

Figure 4:
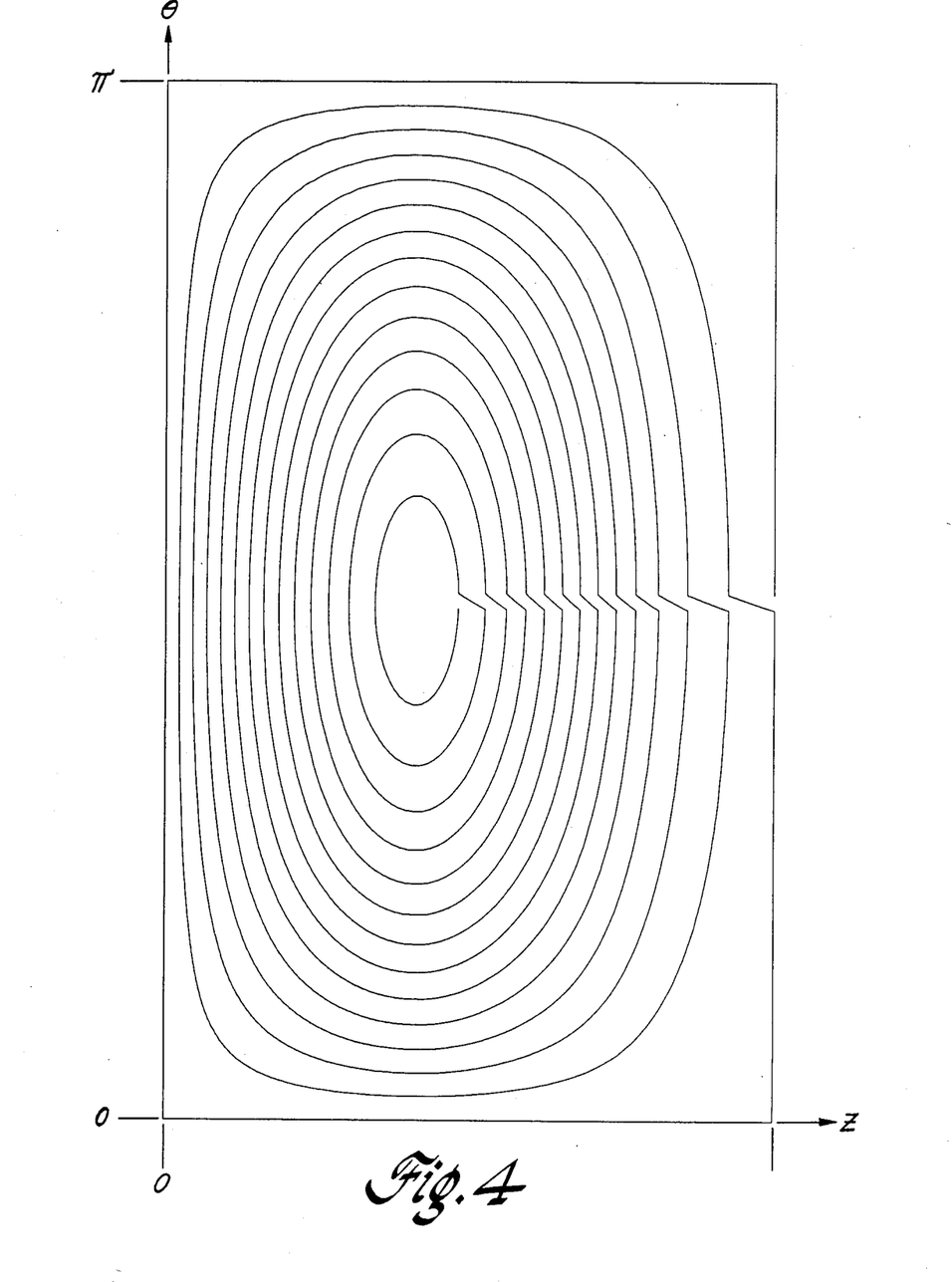
FIG. 4 is a winding pattern of a shielding coil adapted to be used with the pattern of FIG. 3.

A winding pattern corresponding to the function $S_2$ modified by the condition that the magnetic field normal to the outer coil is forced to zero over the length of the coil is shown in FIG. 4. The ratio of outer coil radius $r_o$ to inner coil radius $r_i$ is about 1.3.

In another aspect of the invention, the winding patterns of the inner and outer coils may be concurrently designed by selecting other stream functions for describing the surface currents. An exemplary stream function $S_1$ for an x-gradient or a y-gradient inner coil is:

$$S_1(z,\theta) = \begin{bmatrix} \sum_{n=1}^{N} A_n \sin(\theta)\sin(n z \pi/z_i) & \text{for } |z| < z_i \\ \text{and} \quad 0 & \text{for } |z| > z_i \end{bmatrix}$$

where coefficients $A_n$ are optimization parameters and $z_i$ is one-half of the length of the coil. Similarly, the outer coil stream function $S_2$ is:

$$S_2(z,\theta) = \begin{bmatrix} \sum_{m=1}^{M} B_m \sin(\theta)\sin(m z \pi/z_o) & \text{for } |z| < z_o \\ \text{and} \quad 0 & \text{for } |z| > z_o \end{bmatrix}$$

where $B_m$ are the optimization coefficients and $z_o$ is one-half the truncated length of the outer coil. With these stream functions of more general form, we can proceed to find the stream function coefficients that describe surface currents which produce the desired magnetic fields.

A series of points in space is chosen as a representation of the gradient magnetic field in the imaging volume near the origin. After selecting an initial inner coil length $2 \cdot z_i$ and an initial set of coefficients to work with, the field is calculated at each point in the imaging volume for each coefficient. The coefficients are then modified to minimize the sum of the squares of the difference between the desired gradient and the calculated gradient and to provide shielding such that the magnetic field outside the coil set is substantially zero. Iterations are made by increasing or decreasing the length of the inner coil and by including fewer or greater number of coefficients until a reasonable combination of linearity, current density, power requirements and overall length is obtained.

In general it is desirable to use as small a set of coefficients as possible and as short a length as possible; A shorter length upsets the linearity but lowers the stored energy in the magnetic field. A larger set of coefficients results in improved linearity but also increases the stored energy and creates large variations in current density.

Figure 5:
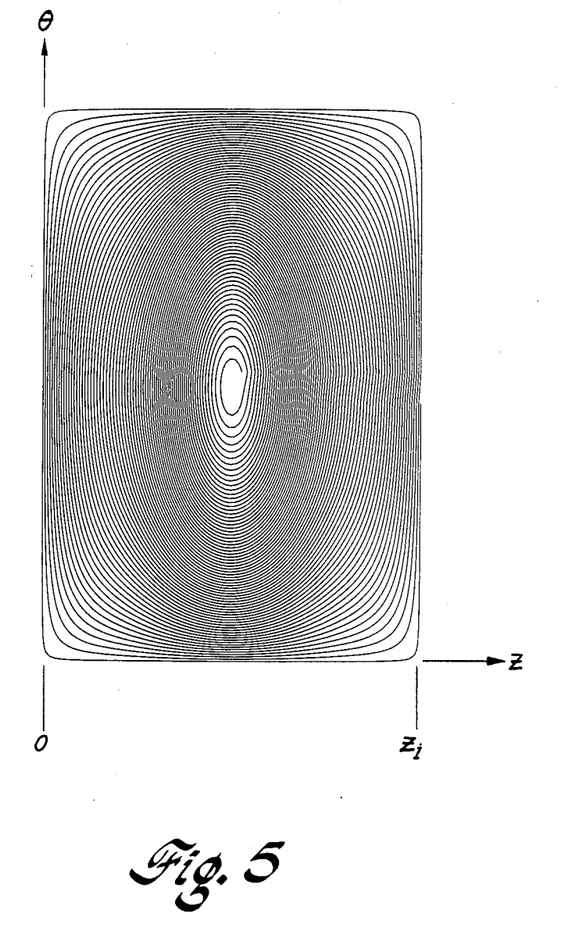
FIG. 5 is a diagram of an exemplary winding configuration of a portion of the inner coil of FIG. 2B.
Figure 6:
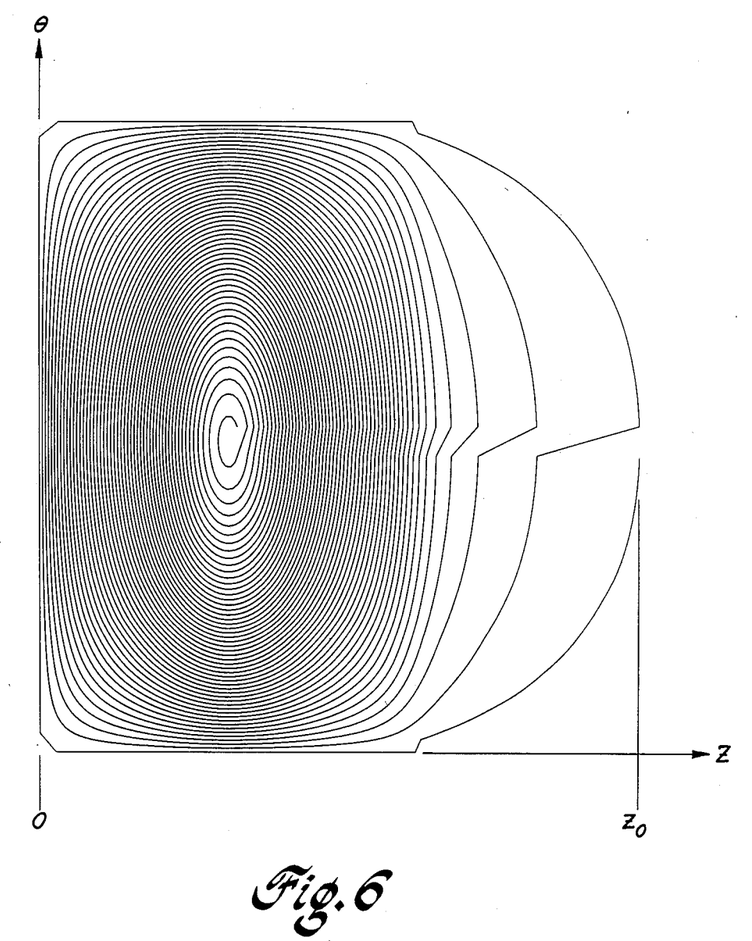
FIG. 6 is a diagram of the winding configuration of a portion of the outer coil of FIG. 2B such that the outside field is zero when used with the winding configuration of FIG. 5.
Figure 8:
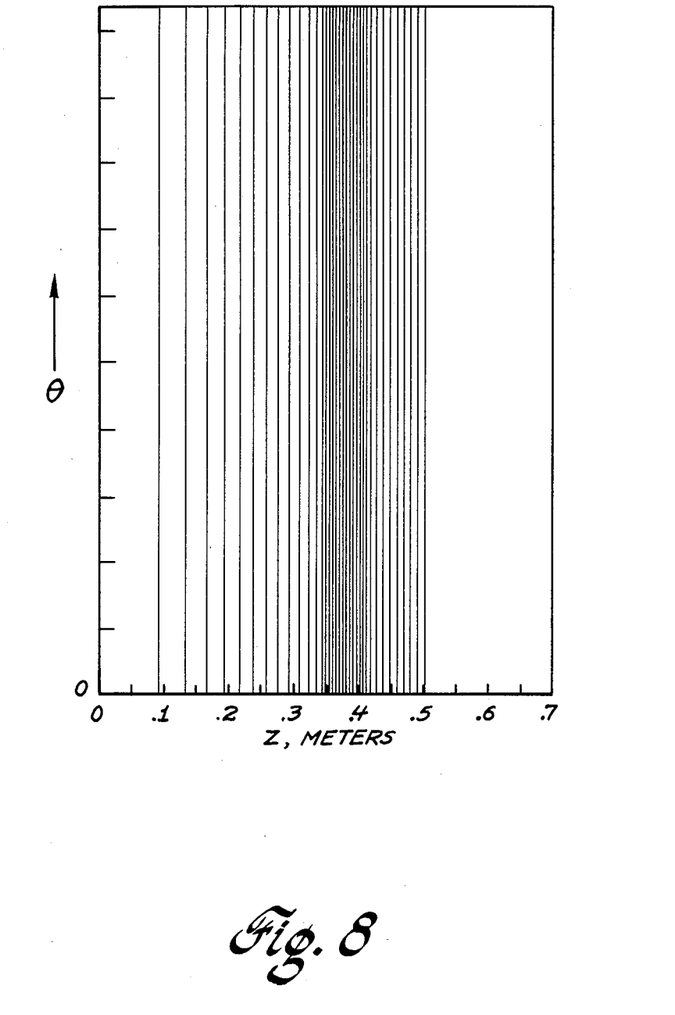
FIG. 8 is a streamline plot for an inner coil of a z-gradient coil set.
Figure 9:
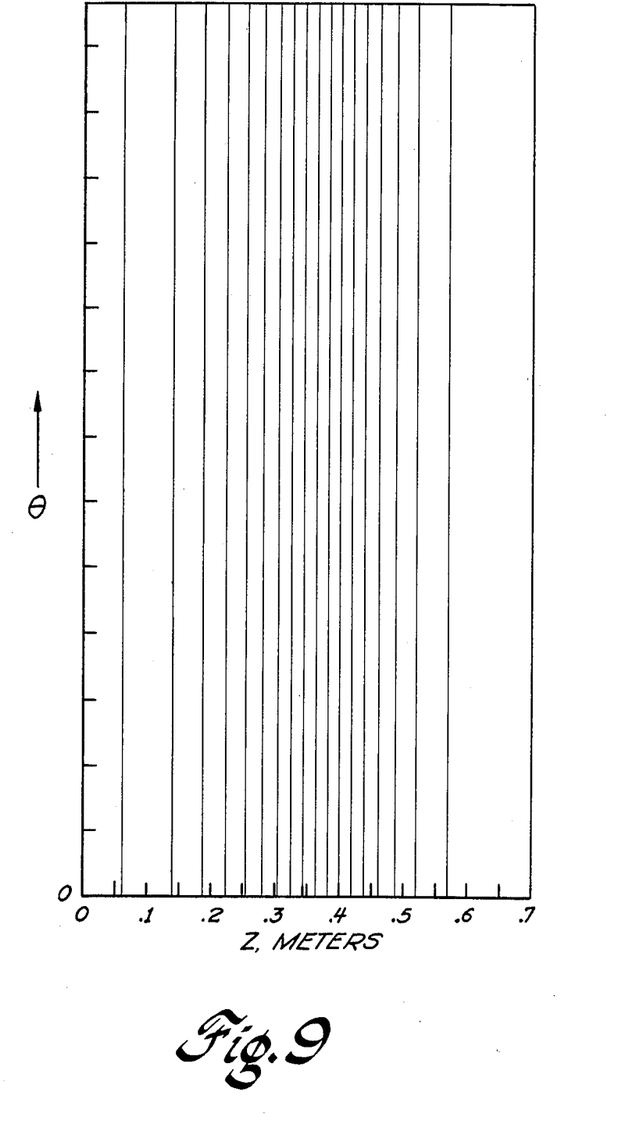
FIG. 9 is a streamline plot for an outer coil corresponding to the inner 1 plot of FIG. 8.

FIGS. 5 and 6 show winding patterns derived by this alternative method and used to etch the inner and outer coil windings, respectively, for an x-gradient or a y-gradient coil system. Coils for a z-gradient may also be employed in a similar manner and have a shape which can be derived according to the above methods by changing the order of the Bessel functions used in the solutions to a zero order. Exemplary streamline plots for the inner and outer coils of such a z-gradient coil system are shown in FIGS. 8 and 9, respectively. The streamlines would be joined to form a continuous path as in the previous examples to form the desired winding pattern.

FIGS. 10–13 are plots of lines of constant magnetic field magnitude produced by the various gradient coils previously described when they are provided with current. The plots show the effectiveness of the coil set of the invention in providing magnetic shielding.

Figure 10:
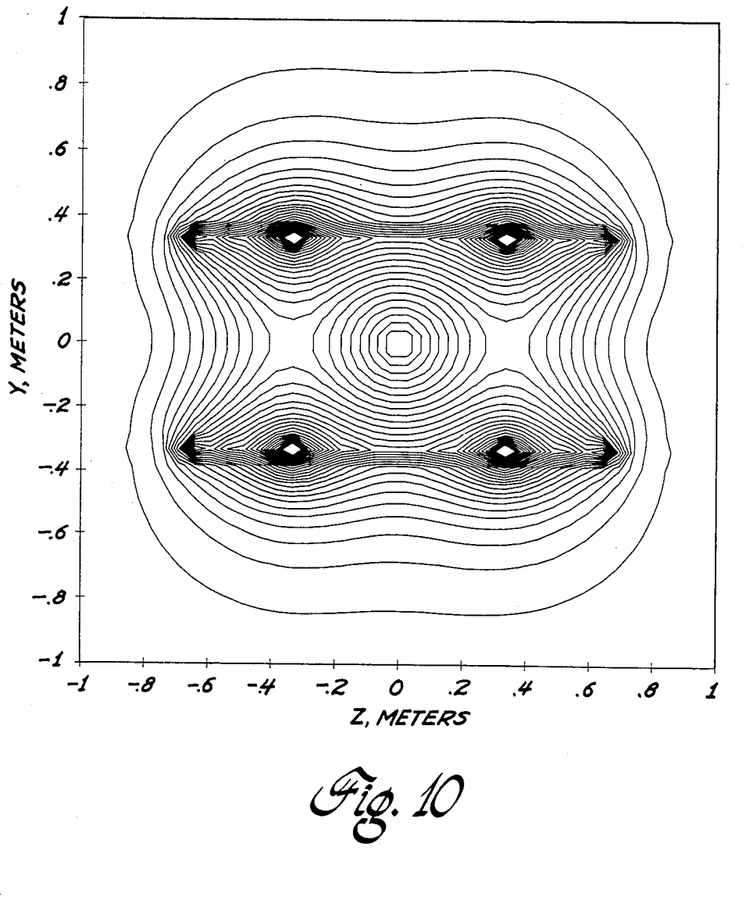
FIGS. 10-13 are magnetic field plots for gradient coils which show the improvement achieved by use of shielding coils.
Figure 11:
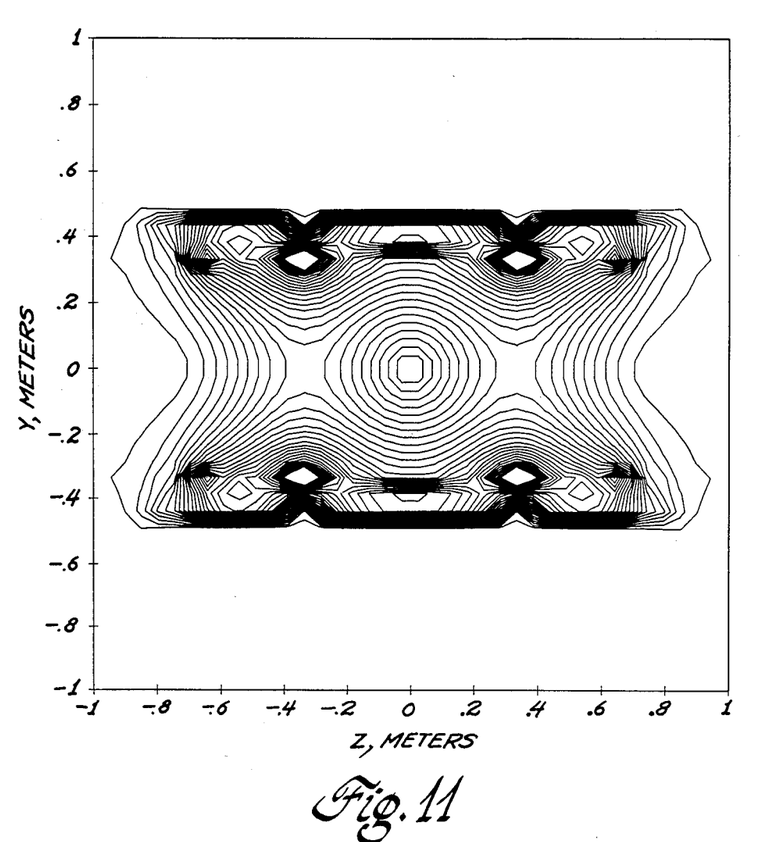

FIG. 10 plots the magnetic field of a single x-gradient or y-gradient coil having the winding pattern of FIG. 3. It is apparent that a significant magnetic field extends to over twice the coil radius of 0.33 meters. When a second coil is added at a radius of 0.44 meters having the winding pattern of FIG. 4, the magnetic field of FIG. 11 results. For comparison purposes, the currents of the inner and outer coils are adjusted to give the same gradient field near the origin as for the case shown in FIG. 10. Although there is a similar magnetic field inside the inner coil, the magnetic field outside the outer coil quickly reduces to zero when radially moving away from the coil set.

Figure 12:
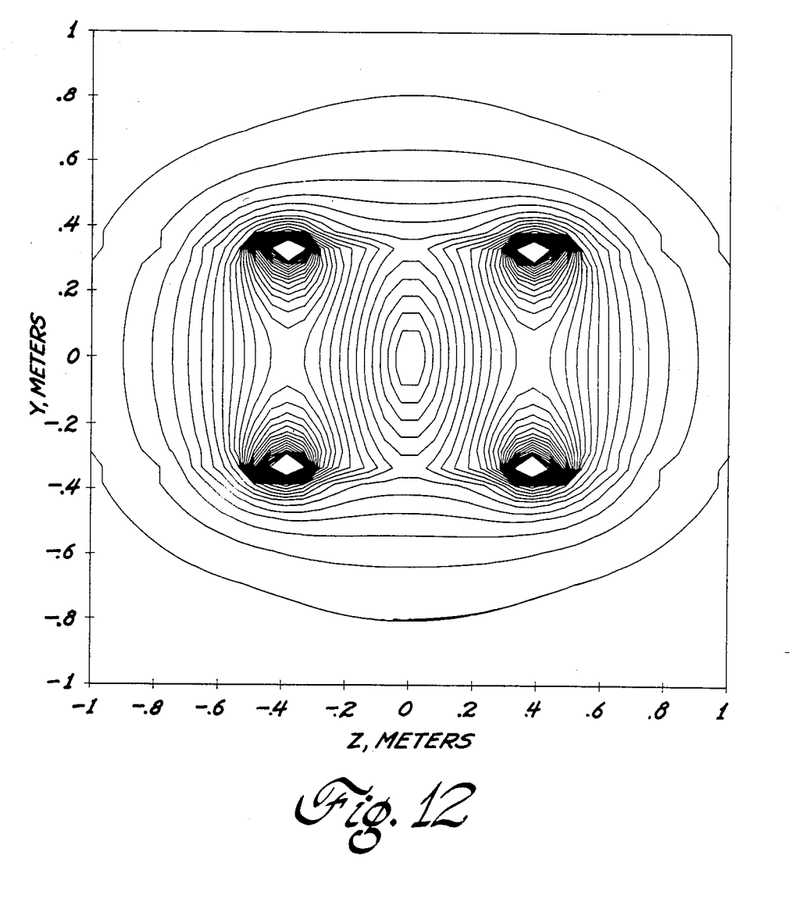
Figure 13:
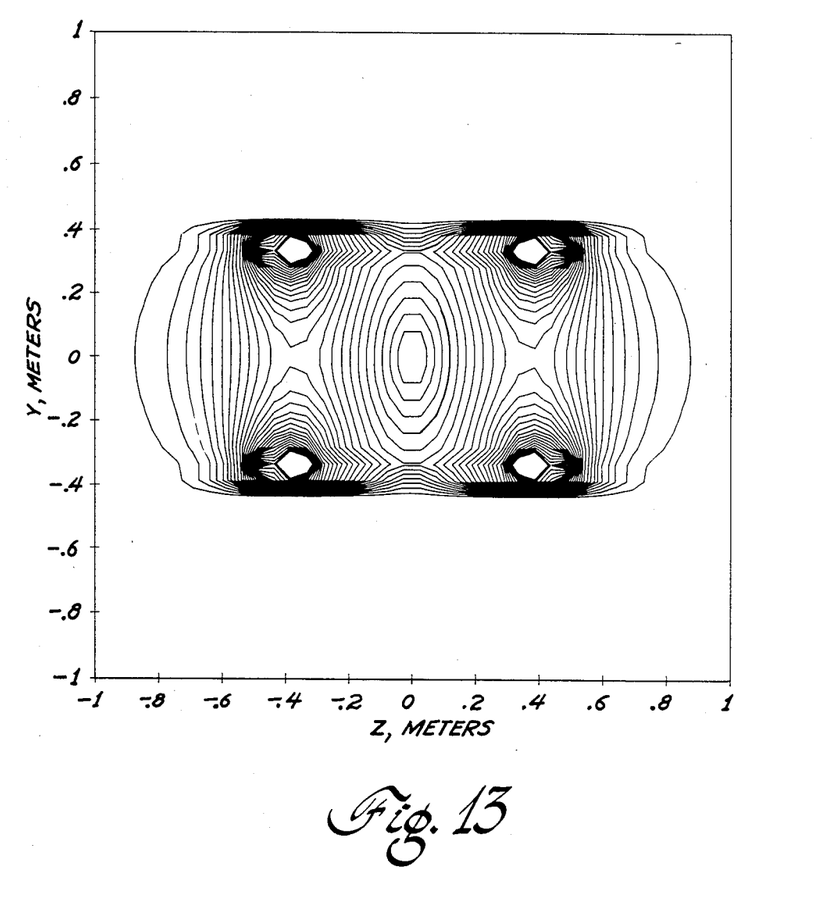

FIGS. 12 and 13 show similar results for a z-gradient coil system. A single z-gradient coil with a winding pattern of the prior art and a radius of 0.33 meters produces the magnetic field plotted in FIG. 12. FIG. 13 plots the magnetic field resulting when inner and outer z-gradient coils having winding patterns derived from the streamline plots of FIGS. 8 and 9 and radii of 0.33 and 0.44 meters, respectively, are used.

FIG. 7 is a cross-sectional view of a magnetic resonance system with a main magnet 40. A gradient coil set 41 according to the invention is located within main magnet 40. An RF coil 42 creates electromagnetic pulses for stimulating resonance of a subject 44 located in an imaging volume 45. The magnetic resonance of subject 44 is detected by an antenna 43. The signal from antenna 43 is used to construct an image of the subject.

The foregoing has described a gradient coil system having reduced interaction with the main magnet. The coil system produces a magnetic field having a linear gradient in the interior of the coil system and having a substantially zero value exterior of the coil system. The elimination of induced eddy currents improves the stability of the gradient field. With the inner and outer coils of the gradient coil set securely fastened together, forces between the gradient coil set and the main magnet substantially cancel so that audible sound is reduced.

While preferred embodiments of the present invention have been shown and described herein, it will be obvious that such embodiments are provided by way of example only. Numerous variations, changes and substitutions will occur to those skilled in the art without departing from the invention. Accordingly, it is intended that the claims fully cover the true spirit and scope of the invention.

What is claimed is:

1. A gradient coil set for an MR apparatus comprising a plurality of radially disposed coils adapted to be placed within a main field magnet, each of said coils adapted to provide a respective surface current distribution, the total magnetic field resulting from the coaction of said surface current distribution having a predetermined gradient in a predetermined single dimension within a predetermined area inside said coil set and a substantially zero value outside said coil set, whereby magnetic forces between said coil set and said field magnet are substantially eliminated.

2. The coil set of claim 1 wherein each of said coils is cylindrically-shaped.

3. The coil set of claim 2 wherein each of said coils is comprised of windings etched on a respective printed circuit board.

4. The coil set of claim 1 wherein said coils are connected in series, said coil set being adapted to receive its operating current from a single power supply.

5. A coil system for producing a magnetic field comprising:
a first coil adapted to be coupled to a source of current for providing a first surface current on the surface of a first cylinder having a radius $r_i$ and an axial length $z_i$; and
a second coil radially disposed from said first coil and adapted to be coupled to a source of current for providing a second surface current on the surface of a second cylinder substantially coaxial with said first cylinder and having a radius $r_o$ greater than $r_i$ and an axial length $z_o$;
said first and second surface currents mutually providing a time-varying magnetic field within the volume enclosed by said first coil and having a substantially zero value at all times in the volume outside of said second coil, whereby magnetic forces between said coil system and nearby electronically conductive structure are substantially eliminated.

6. The coil system recited in claim 5 wherein said axial length $z_o$ is greater than said axial length $z_i$.

7. The coil system recited in claim 6 wherein said first and second coils are comprised of windings etched on first and second printed circuit boards, respectively, each of said printed circuit boards being curved to form said cylinders.

8. The coil system of claim 5 wherein said coils are connected in series.

9. A coil system for producing a magnetic field comprising:
an inner coil adapted to be coupled to a source of current and having a radius $r_i$ and an axial length $2 \cdot z_i$ for providing an inner surface current distribution substantially equal to the derivative of a first stream function, said first stream function defined over variables $z$ and $\theta$ where $z$ is the axial coordinate which varies from $-z_i$ to $+z_i$ and where $\theta$ is the circumferential coordinate which varies from $\theta$ to $2\pi$, said first stream function including a plurality of coefficients $A_n$ where $n$ is a whole number from 1 to a predetermined number N, said first stream function defined by the equation $$S_1(z,\theta) = \begin{bmatrix} \sum_{n=1}^{N} A_n \sin(\theta)\sin(n z \pi / z_i) & \text{for } |z| < z_i \\ \text{and} \quad 0 & \text{for } |z| > z_i \end{bmatrix}; \text{ and}$$

an outer coil adapted to be coupled to a source of current substantially coaxial with said inner coil and having a radius $r_o$ and an axial length $2 \cdot z_o$ for providing an outer surface current distribution substantially equal to a second stream function where $z$ varies from $-z_o$ to $+z_o$, said second stream function including a plurality of coefficients $B_m$ where $m$ is a whole number from 1 to a predetermined number M, said second stream function defined by the equation $$S_2(z,\theta) = \begin{bmatrix} \sum_{m=1}^{M} B_m \sin(\theta)\sin(m z \pi / z_o) & \text{for } |z| < z_o \\ \text{and} \quad 0 & \text{for } |z| > z_o \end{bmatrix};$$

said inner and outer surface current distributions being adapted to produce a magnetic field having a gradient in a predetermined dimension and a substantially constant value across the other two dimensions within the volume enclosed by said inner coil and having a substantially zero value in the volume outside of said outer coil, said coefficients having values which minimize within predetermined limits the sum of squares difference between the desired gradient of said magnetic field and said gradient produced.

10. The coil system of claim 9 wherein said inner and outer coils are comprised of windings etched on first and second printed circuit boards, respectively, each of said first and second printed circuit boards being curved to form cylinders.

11. A magnetic resonance system comprising:
a main magnet for establishing a uniform magnetic field in an imaging volume in the interior of said main magnet;
radio-frequency means for pulsing said imaging volume with electromagnetic energy for stimulating nuclear magnetic resonance of nuclei within said imaging volume;
detecting means for sensing the nuclear magnetic resonance of nuclei within said imaging volume; and
a first gradient coil set located within said uniform magnetic field of said main magnet, said first coil set being comprised of an inner and an outer coil, said inner coil adapted to be coupled to a source of current for providing a first surface current distribution on the surface of a first cylinder having a radius $r_i$ and an axial length $z_i$, said outer coil adapted to be coupled to a source of current for providing a second surface current distribution on the surface of a second cylinder substantially coaxial with said first cylinder and having a radius $r_o$ greater than $r_i$ and an axial length $z_o$, said first and second surface currents being adapted to mutually produce a magnetic field having a gradient in a first dimension and a constant value across the other two orthogonal dimensions within said first coil set and having a substantially zero value outside of said first coil set.

12. The magnetic resonance system of claim 11 further comprising second and third gradient coil sets for establishing magnetic fields having gradients in each of the two remaining dimensions, respectively, within the respective coil sets and having substantially zero values outside the respective coil sets.

13. A coil system for applying a gradient magnetic field to a sample comprising a plurality of electrically connected conductor windings radially disposed from an area for containing said sample and from each other, said plurality of windings adapted to receive current flow such that said gradient magnetic field is produced in said sample area while the area external to said plurality of windings is actively shielded from said gradient magnetic field by the mutual action of said plurality of windings.

14. A method for applying a magnetic field to a sample during an NMR measurement comprising the step of:

simultaneously energizing a plurality of electrically connected conductor windings radially disposed from said sample and from each other, said plurality of windings producing said magnetic field within said sample and actively shielding the area external to said plurality of windings from said magnetic field.

* * * * *

REEXAMINATION CERTIFICATE (1006th)
United States Patent [19]
Roemer et al.

[11] B1 4,737,716
[45] Certificate Issued Jan. 24, 1989

[54] SELF-SHIELDED GRADIENT COILS FOR NUCLEAR MAGNETIC RESONANCE IMAGING

[75] Inventors: Peter B. Roemer, Schenectady; John S. Hickey, Burnt Hills, both of N.Y.

[73] Assignee: General Electric Company, Milwaukee, Wis.

Reexamination Request:
No. 90/001,511, May 25, 1988

Reexamination Certificate for:
Patent No.: 4,737,716
Issued: Apr. 12, 1988
Appl. No.: 826,650
Filed: Feb. 6, 1986

[51] Int. Cl.$^4$ .............................................. G01R 33/20
[52] U.S. Cl. ...................................... 324/319; 324/318
[58] Field of Search ................ 324/300, 309, 313, 318, 324/319, 320, 322; 336/225; 335/210, 216, 209, 299

[56] References Cited
U.S. PATENT DOCUMENTS
4,595,899  6/1986  Smith et al. ......................... 324/320

*Primary Examiner*—Michael J. Tokar

[57] ABSTRACT

A two coil system is described which produces a linear gradient field inside and an arbitrarily low field outside the two coil set. By eliminating the field outside the gradient coils, interaction between the gradient coils and external structure can be eliminated. A reduction in eddy current effects of greater than a factor 100 are readily obtained. Two coils are required for each gradient axis instead of one so that some increase in power supply capability may be required.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 9 and 10 is confirmed.

Claim 6 is cancelled.

Claims 1, 5, 7 and 11–14 are determined to be patentable as amended.

Claims 2–4 and 8, dependent on an amended claim, are determined to be patentable.

New claim 15 is added and determined to be patentable.

1. A gradient coil set for an MR apparatus comprising a plurality of radially disposed *fingerprint* coils adapted to be placed within a main field magnet, each of said coils adapted to provide a respective surface current distribution, the total magnetic field resulting from the coaction of said surface current distribution having a predetermined gradient in a predetermined single dimension within a predetermined area inside said coil set and a substantially zero value outside said coil set, whereby magnetic forces between said coil set and said field magnet are substantially eliminated.

5. A coil system for producing a magnetic field comprising:
a first coil adapted to be coupled to a source of current for providing a first surface current on the surface of a first cylinder having a radius $r_i$ and an axial length $z_i$, and
a second coil radially disposed from said first coil and adapted to be coupled to a source of current for providing a second surface current on the surface of a second cylinder substantially coaxial with said first cylinder and having a radius $r_o$ greater than $r_i$ and an axial length $z_o$ *greater than $z_i$*;
said first and second surface currents mutually providing a time-varying magnetic field within the volume enclosed by said first coil and having a substantially zero value at all times in the volume outside of said second coil, whereby magnetic forces between said coil system and nearby [electronically] *electrically* conductive structure are substantially eliminated.

7. The coil system recited in claim [6] *5* wherein said first and second coils are comprised of windings etched on first and second printed circuit boards, respectively, each of said printed circuit boards being curved to form said cylinders.

11. A magnetic resonance system comprising:

a main magnet for establishing a uniform magnetic field in an imaging volume in the interior of said main magnet;
radio-frequency means for pulsing said imaging volume with electromagnetic energy for stimulating nuclear magnetic resonance of nuclei within said imaging volume;
detecting means for sensing the nuclear magnetic resonance of nuclei within said imaging volume; and
a first gradient coil set located within said uniform magnetic field of said main magnet, said first coil set being comprised of an inner and an outer coil, said inner coil adapted to be coupled to a source of current for providing a first surface current distribution on the surface of a first cylinder having a radius $r_i$ and an axial length $z_i$, said outer coil adapted to be coupled to a source of current for providing a second surface current distribution on the surface of a second cylinder substantially coaxial with said first cylinder and having a radius $r_o$ greater than $r_i$ and an axial length $z_o$, said first and second surface currents being adapted to mutually produce a *non-dipolar* magnetic field having a gradient in a first dimension and a constant value across the other two orthogonal dimensions within said first coil set and having a substantially zero value outside of said first coil set.

12. The magnetic resonance system of claim 11 further comprising second and third gradient coil sets for establishing *non-dipolar* magnetic fields having gradients in each of the two remaining dimensions, respectively, within the respective coil sets and having substantially zero values outside the respective coil sets.

13. A coil system for applying a *non-dipolar* gradient magnetic field to a sample comprising a plurality of electrically connected conductor windings radially disposed from an area for containing said sample and from each other, said plurality of windings adapted to receive current flow such that said *non-dipolar* gradient magnetic field is produced in said sample area while the area external to said plurality of windings is actively shielded from said gradient magnetic field by the mutual action of said plurality of windings.

14. A method for applying a *non-dipolar* magnetic field to a sample during an NMR measurement comprising the step of:
simultaneously energizing a plurality of electrically connected conductor windings radially disposed from said sample and from each other, said plurality of windings producing said *non-dipolar* magnetic field within said sample and actively shielding the area external to said plurality of windings from said magnetic field.

*15. A gradient coil set for an MR apparatus comprising a plurality of radially disposed, cylindrically-shaped coils adapted to be placed within a main field magnet, each of said coils being comprised of windings etched on a respective printed circuit board and being adapted to provide a respective surface current distribution, the total magnetic field resulting from the coaction of said surface current distribution having a predetermined gradient in a predetermined single dimension within a predetermined area inside said coil set and a substantially zero value outside said coil set, whereby magnetic forces between said coil set and said field magnet are substantially eliminated.*

* * * * *